(12) United States Patent
Nakagawa et al.

(10) Patent No.: US 9,421,638 B2
(45) Date of Patent: Aug. 23, 2016

(54) LASER PROCESSING APPARATUS AND LASER PROCESSING METHOD USING THE SAME TECHNICAL FIELD

(75) Inventors: Yoshinori Nakagawa, Osaka (JP); Mitsuo Hara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 2459 days.

(21) Appl. No.: 12/295,041

(22) PCT Filed: Dec. 20, 2007

(86) PCT No.: PCT/JP2007/074498
§ 371 (c)(1),
(2), (4) Date: Sep. 29, 2008

(87) PCT Pub. No.: WO2008/084642
PCT Pub. Date: Jul. 17, 2008

(65) Prior Publication Data
US 2009/0173723 A1 Jul. 9, 2009

(30) Foreign Application Priority Data
Dec. 22, 2006 (JP) .................................. 2006-345492

(51) Int. Cl.
*B23K 26/00* (2014.01)
*B23K 26/02* (2014.01)
(Continued)

(52) U.S. Cl.
CPC ........... *B23K 26/0853* (2013.01); *B23K 26/082* (2015.10); *B23K 26/382* (2015.10); *B23K 26/40* (2013.01); *B23K 26/402* (2013.01); *B23K 37/0408* (2013.01); *H05K 3/0032* (2013.01); *B23K 2201/35* (2015.10); *B23K 2203/08* (2013.01); *B23K 2203/16* (2013.01);
(Continued)

(58) Field of Classification Search
CPC .......... B23K 2201/35; B23K 2203/08; B23K 2203/16; B23K 2203/38; B23K 2203/42; B23K 2203/50; B23K 26/082; B23K 26/0853; B23K 26/382; B23K 26/40; B23K 26/402; B23K 37/0408; H05K 2203/0165
USPC ............... 219/121.71, 121.7, 121.82, 121.83, 219/121.78, 121.81
See application file for complete search history.

(56) References Cited

U.S. PATENT DOCUMENTS 4,723,766 A * 2/1988 Beeding .......................... 269/21
6,090,330 A 7/2000 Gawa et al.
(Continued)

FOREIGN PATENT DOCUMENTS

CN 1190047 A 8/1998
JP 59-127988 A 7/1984
(Continued)

OTHER PUBLICATIONS

CN OA for Application No. 200780026923.2, Jan. 25, 2011, Panasonic Corporation.
(Continued)

*Primary Examiner* — Sang Y Paik
(74) *Attorney, Agent, or Firm* — RatnerPrestia

(57) ABSTRACT

A laser processing apparatus is provided in which its XY table is composed of plural divided blocks vertically movable, at least one divided block is stopped while it is moving down, and a through hole is formed by irradiating a workpiece in an area corresponding to a position directly above the divided block with a laser beam.

10 Claims, 4 Drawing Sheets

(51) Int. Cl.
*B23K 26/08* (2014.01)
*B23K 37/04* (2006.01)
*H05K 3/00* (2006.01)
*B23K 26/40* (2014.01)

(52) U.S. Cl.
CPC ......... *B23K2203/38* (2015.10); *B23K 2203/42* (2015.10); *B23K 2203/50* (2015.10); *H05K 2203/0165* (2013.01); *H05K 2203/082* (2013.01)

(56) References Cited

U.S. PATENT DOCUMENTS

| | | | |
|---|---|---|---|
| 6,285,000 | B1 | 9/2001 | Gawa et al. |
| 6,386,805 | B1 | 5/2002 | Suzuki |
| 6,403,920 | B1 * | 6/2002 | Muneyuki et al. ....... 219/121.77 |
| 6,588,738 | B1 * | 7/2003 | Sukuvaara et al. ........... 269/293 |
| 7,703,190 | B2 * | 4/2010 | Halford ........................... 29/557 |

FOREIGN PATENT DOCUMENTS

| | | | |
|---|---|---|---|
| JP | 62-077688 | | 5/1987 |
| JP | 62-077688 U | | 5/1987 |
| JP | 63-111291 | | 7/1988 |
| JP | 06-071475 A | | 3/1994 |
| JP | 11-192571 A | | 7/1999 |
| JP | 11-254166 | | 9/1999 |
| JP | 2000-015472 A | | 1/2000 |
| JP | 2000-153427 A | | 6/2000 |
| JP | 2000-233291 A | | 8/2000 |
| WO | WO 2005061182 A2 * | 7/2005 | ................ B25B 1/24 |

OTHER PUBLICATIONS

Supplementary European Search Report for Application No. EP 07 85 9895, Oct. 20, 2010, Panasonic Corporation.
International Search Report for International Application No. PCT/JP2007/074498 dated Apr. 1, 2008.

* cited by examiner

LASER PROCESSING APPARATUS AND LASER PROCESSING METHOD USING THE SAME TECHNICAL FIELD

This application is a U.S. National Phase Application of PCT International Application PCT/JP2007/074498.

TECHNICAL FIELD

The present invention relates to a laser processing apparatus for processing (e.g. drilling) a workpiece such as a circuit substrate and to a method of the same.

BACKGROUND ART

FIG. 6 illustrates the configuration of a conventional laser processing apparatus. In FIG. 6, the laser processing apparatus drills a fine hole in a workpiece such as substrate 57 by irradiating the workpiece with a laser beam. A description is made for the configuration of the conventional laser processing apparatus.

First, laser beam 52 is emitted from laser oscillator 51, direction-converted by reflecting mirror 53a, and then is led from reflecting mirror 53b, 53c toward galvanometers 54, 55 including a two-axis (X, Y) galvanometer mirror. Then, laser beam 52 is launched into fθ lens 56 with its irradiation direction changed by the operation of galvanometers 54, 55 and focused, then substrate 57 positioned on XY table 58 is irradiated with laser beam 52.

Substrate 57 is irradiated with laser beam 52 while scanning processed area A, a given range of substrate 57, in the direction X-Y. At the time when irradiating processed area A completes, XY table 58 is moved in direction X, Y, or X and Y, and after the next processed area is reached, substrate 57 is laser-processed again.

In the same way, areas of substrate 57 to be processed are sequentially processed.

For example, patent literatures 1 and 2 are known as information on prior art documents related to the present invention.

Here, when processing a through hole by a laser processing method using the above-described laser processing apparatus, a space is required between XY table 58 and substrate 57. Meanwhile, for a non-through hole, no space is required.

Conventionally, a through hole is processed with such a jig placed on the XY table; a non-through hole is processed with the substrate placed on the XY table.

More specifically, when forming a through hole in a thin sheet made of a material referred to as prepreg that is woven or nonwoven fabric impregnated with resin and partially hardened (prepreg sheet hereinafter), or in a thin sheet provided with copper foil (including a conductor circuit) on its outer layer, processing is made with a jig for pulling the ends of the sheet to retain the thin sheet in midair while tensioning it.

Particularly, when providing a through hole in a prepreg sheet, if performing laser processing after positioning the prepreg sheet directly on the XY table and placing it on the table, the resin partially hardening in the prepreg sheet is deposited on the XY table due to heat during the laser processing, preventing a desired through hole from being formed, and thus requiring the above-described jig for pulling the ends of the sheet.

However, if retaining the prepreg sheet in midair while tensioning it with a jig for pulling the ends of the sheet, a thin prepreg sheet with the resin partially hardening may undesirably change in its processing dimensions during laser processing. Especially for a multilayer printed wiring board in which a prepreg sheet with a conductive paste filling a hole to be processed by laser used as an interlayer connector, deviation in the position of an interlayer conducting hole occurs due to a dimensional change and unevenness of the prepreg sheet, possibly decreasing the reliability in electrical connection.

Meanwhile, in a process of manufacturing what is called a build-up multilayer printed wiring board provided with a non-through conducting hole in its outer layer, to form a non-through hole in the outer layer, processing needs to be made by positioning a sheet-like substrate on the XY table and placing the substrate on the table, and by sucking the substrate at its bottom surface to fix it. The reason is, if the sheet-like substrate of the build-up multilayer printed wiring board, usually having a multilayered structure of 4 to 10 layers, is retained in midair using a jig for pulling the ends of the sheet, deformation caused by the own weight occurs, thereby preventing a non-through hole in the outer layer to be formed with a high degree of accuracy.

Accordingly, handling has been made to form both non-through and through holes in a sheet-like substrate as the following. That is, laser processing is made while the sheet is retained in midair using a jig for pulling the ends of the sheet for a through hole; the sheet is placed on the XY table for a non-through hole.

However, the above-described conventional method results in executing setting of the laser processing apparatus twice for hole drilling in one sheet-like substrate, which may lower the accuracy in the position of holes, significantly decreasing the productivity for printed wiring boards.

[Patent literature 1] Japanese Patent Unexamined Publication No. H11-254166

[Patent literature 2] Japanese Patent Unexamined Publication No. 2000-233291

SUMMARY OF THE INVENTION

A laser processing apparatus of the present invention performs laser processing for through and non-through holes without using a jig for pulling the ends of a sheet on the XY table of the laser processing apparatus when forming through and non-through holes in a prepreg sheet or a sheet-like substrate.

A laser processing apparatus of the present invention includes at least a laser oscillator, a reflecting mirror, a galvanometer mirror, a lens, and an XY table on which a workpiece is placed, where the XY table is composed of plural divided blocks vertically movable.

A laser processing method of the present invention, using this laser processing apparatus is, with at least one divided block out of plural divided blocks vertically movable being in a downward stopped state, to form a through hole by irradiating a workpiece in an area corresponding to the position directly above the divided block; or, with at least one divided block out of plural divided blocks vertically movable being in a upward stopped state, to form a non-through hole by irradiating a workpiece in an area corresponding to the position directly above the divided block.

With a laser processing apparatus and a laser processing method according to the present invention, tensioning is not required even when laser-processing thin substrate material such as a prepreg sheet, thereby enabling laser processing while maintaining the dimensions of the substrate stably.

For drilling a hole in a substrate, only one-time setting of the laser processing apparatus allows laser processing for both through and non-through holes, thereby eliminating unevenness caused by positioning to improve the accuracy in laser processing position.

Especially in processing a multilayer substrate including a circuit in its inner layer, deformation caused by the substrate's own weight is eliminated, thereby allowing both through and non-through holes to be processed, which especially improves the processing accuracy of non-through holes The divided blocks composing a laser processing apparatus of the present invention have plural sucking holes, enabling the divided blocks to suck and to release the substrate independently. The sucking holes are linked to an air intake and exhaust means for the operation of intake, release of intake, exhaust, and release of exhaust, allowing the substrate to be sucked and retained while individual divided blocks move up and down independently.

The intake and exhaust device linked to the sucking holes performs intake or release of intake while the divided block is in a stopped state after moving up; and exhausts air and releases exhaust while the divided block is in a stopped state after moving down. This mechanism releases sucking of the substrate sucked and retained when the divided block in a stopped state after moving up moves down, thereby allowing the divided block to be moved down smoothly. Meanwhile, for a divided block in a stopped state after moving down, the sucking hole exhausts air to make the intake hole be in a pressure discharged state, thereby preventing the sucking hole to be clogged due to dust produced in laser processing.

The laser processing apparatus of the present invention emits a laser beam from its laser oscillator, and irradiates the XY table with the laser beam through the reflecting mirror and galvanometer mirror lens. The laser processing apparatus has a galvano processed area, which is an area where a workpiece is laser-processed according to the operation of a galvanometer. The laser processing apparatus operates so that a divided block corresponding to this galvano processed area is in a stopped state after moving down and that not corresponding is in a stopped state after moving up. With this mechanism, the laser processing apparatus retains the position and state of the substrate positioned and can form a through hole by laser processing while maintaining the processing dimensions stably.

Desirably, a galvano processed area moves by horizontal movement of the XY table, and a processed area composed of plural galvano processed areas in a row or a line to be processed with the movement of the XY table in only one direction is set to an area equivalent to one divided block. This structure reduces the number of operations of moving up and down of a divided block; and intake, release of intake, exhaust, and release of exhaust of a sucking hole, thereby improving the productivity and minimizing the influence of movement on the processing accuracy.

Desirably, a divided block is rectangular, and the longitudinal length of a processed area composed of plural galvano processed areas in a row or a line is set to be shorter than the longitudinal length of this divided block. With this structure, a processed area composed of plural galvano processed areas in a row or a line can be set within one divided block, thereby improving the productivity and minimizing the influence of movement on the processing accuracy.

Desirably, for divided blocks adjacent to one another, when either one of the blocks moves down, a gap is formed between the block and its adjacent blocks, and the gap is for collecting dust produced from a workpiece. With this structure, dust collection can be made only for a divided block moving down, namely a galvano processed area, thus increasing the efficiency of dust collection; starting and stopping of dust collection for the area can be performed simultaneously with vertical movement of the divided block; and the mechanism of the apparatus can be simplified.

Desirably, the XY table of a laser processing apparatus of the present invention is provided with intake holes and intake devices for sucking and retaining a workpiece to be placed at the ends of the four sides of the XY table. With this structure, a workpiece such as a substrate positioned can be sucked and retained, thus retaining the workpiece stably in horizontal movement of the XY table and vertical movement of the divided block.

With the above-described configuration, when laser-processing a thin sheet-like workpiece, the present invention does not need to tension the workpiece at all and performs laser processing while maintaining the processing dimensions stably.

Further, only one-time setting of a workpiece to the laser processing apparatus enables laser processing through and non-through holes, thereby eliminating unevenness caused by positioning to improve the accuracy in laser processing position and significantly improving the productivity.

REFERENCE MARKS IN THE DRAWINGS

Figure 1:
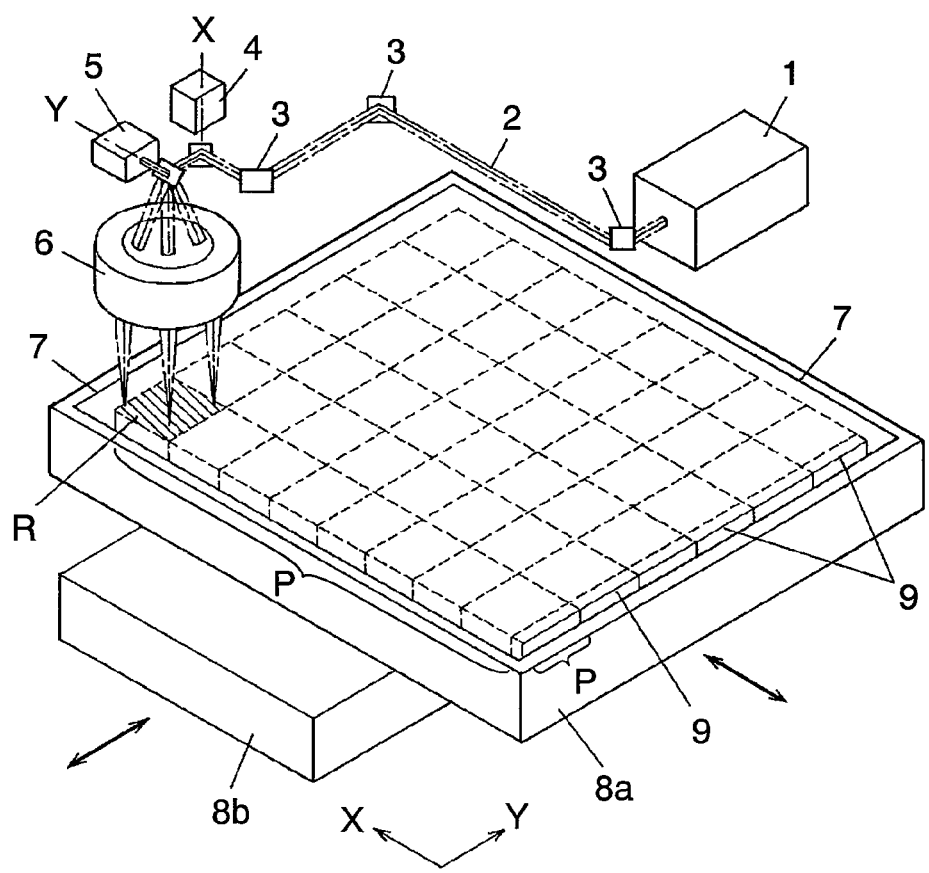
FIG. 1 illustrates the configuration of a laser processing apparatus according to the embodiment of the present invention.

1 Laser oscillator
2 Laser beam
3 Reflecting mirror
4, 5 Galvanometer
6 fθ lens
7 Substrate
8a, 8b XY table
9, 9a, 9b, 9c Divided block
10 Gap
R Galvano processed area
P Processed area

DETAILED DESCRIPTION OF PREFERRED EMBODIMENT EXEMPLARY EMBODIMENT

Figure 2:
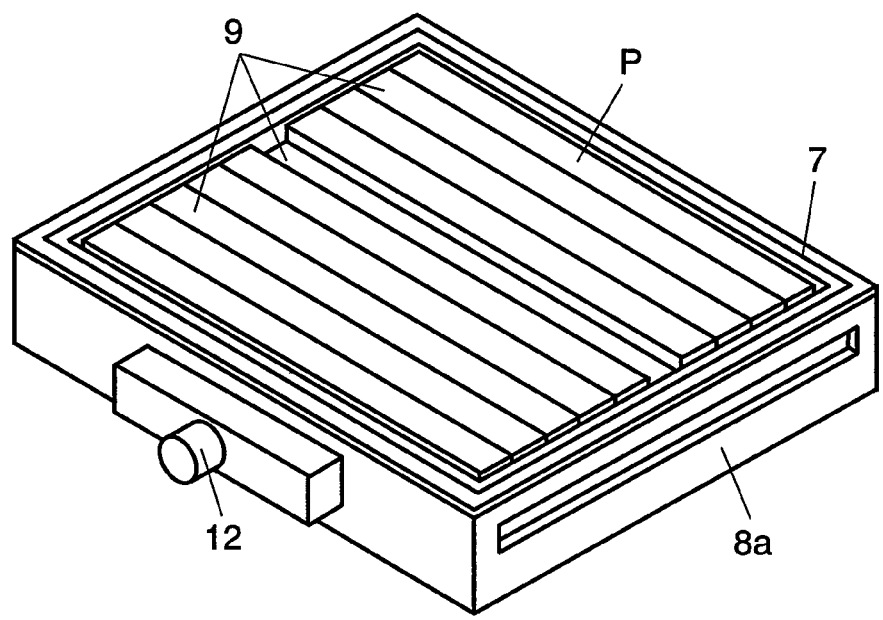
FIG. 2 is a schematic diagram of the XY table of the laser processing apparatus according to the same embodiment.

FIG. 1 illustrates the configuration of a laser processing apparatus according to the embodiment of the present invention. FIG. 2 is a schematic diagram of the XY table of the laser processing apparatus according to the same embodiment. In FIGS. 1, 2, the laser processing apparatus of the present invention includes laser oscillator 1, reflecting mirror 3, galvanometers 4, 5 with two-axis (X-Y) galvanometer mirror, and fθ lens 6. The operation of the apparatus and the configuration of its optical system such a path through which substrate 7 (i.e. workpiece) is irradiated with laser beam 2 emitted from laser oscillator 1 are roughly the same as those of a conventional one, thus their detailed description is omitted. Although this embodiment has one optical system to simplify the description and drawings, the invention is applicable to an apparatus with two optical systems (i.e. what is called a two-axis laser processing apparatus), where a branching means is provided between laser oscillator 1 and reflecting mirror 3.

In XY table 8a on which a workpiece is placed, plural divided blocks 9 are assembled to form the entire processed area. Assuming that a part corresponding to a unit of one row or one line of galvano processed areas R out of the entire processed area is one processed area P, an aggregate of plural divided blocks 9 corresponding to P composes the major area of XY table 8a, where individual divided blocks 9 independently moves vertically.

The laser processing apparatus of the present invention operates so that a divided block corresponding to galvano processed area R is in a downward stopped state; a divided block not corresponding to R is in an upward stopped state. Here, a divided block in an upward stopped state can be set to galvano processed area R.

XY table 8a includes intake holes and intake devices (not shown) for sucking and retaining substrate 7 to be placed, at the four sides of XY table 8a. This structure enables sucking and retaining a workpiece such as a substrate positioned, thus retaining the workpiece stably in horizontal movement of XY table 8a and vertical movement of divided block 9.

Here, galvano processed area R refers to an irradiated area formed by the operation of galvanometers 4, 5 when XY table 8a is irradiated with laser beam 2 emitted from laser oscillator 1 through the optical system, the area corresponding to square area R in FIG. 1.

Galvano processed area R moves according to horizontal movement in direction X or Y of XY tables 8a, 8b. In this embodiment, the case is presented where galvano processed area R moves only in one direction (direction X) of XY table 8a, namely along divided block 9, and then moves (in direction Y) to the next divided block.

Desirably, divided block 9 is rectangular, and the longitudinal length of a processed area composed of plural galvano processed areas R in a row or a line is set to be shorter than the longitudinal length of divided block 9. With this structure, processed area P composed of plural galvano processed areas R in a row or a line can be set within one divided block 9, thereby simplifying the operation of XY tables 8a, 8b, improving the productivity, and minimizing the adverse influence of movement on the processing accuracy.

Figure 3:
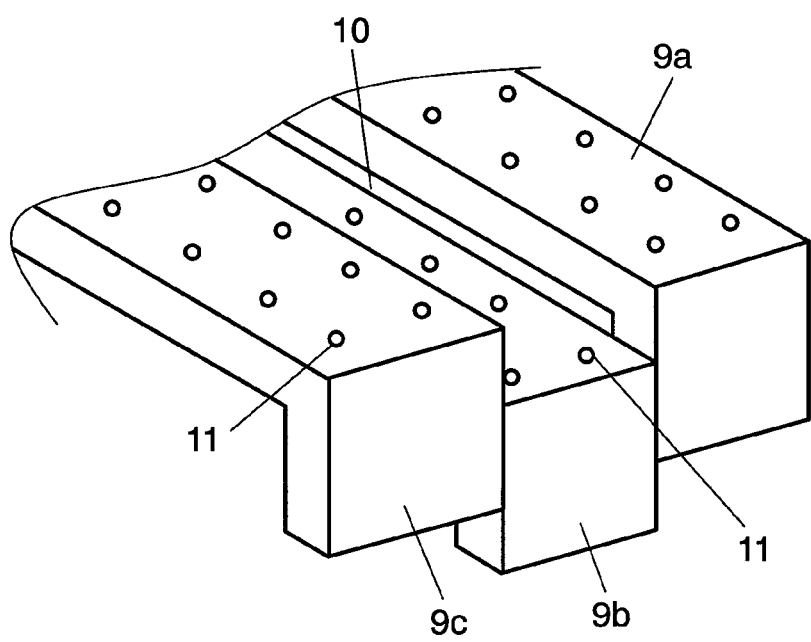
FIG. 3 illustrates the substantial part of the configuration of the laser processing apparatus according to the same embodiment.

FIG. 3 illustrates the configuration of the laser processing apparatus according to the same embodiment. In FIG. 3, divided blocks 9a, 9b, 9c have intake holes 11 for sucking a substrate, where each divided block independently has a means and function for intake, release of intake, exhaust, and release of exhaust. Concretely, intake hole 11 of each divided block 9a, 9b, 9c is linked to an intake and exhaust device for intake, release of intake, exhaust, and release of exhaust through such as a flexible tube, and the intake and exhaust device is controlled by a control circuit according to vertical movement of divided blocks 9a, 9b, 9c.

With the above-described configuration, in a downward stopped state such as in divided block 9b, a small amount of exhaust makes intake hole 11 be in a pressure discharged state, thereby preventing sucking hole 11 to be clogged due to dust.

XY table 8a made of an aggregate of plural divided blocks 9 can collect dust produced in processing through gap 10 for dust collection formed between adjacent divided blocks 9a, 9c while one divided block 9b is in a downward state. The dust collected is sent to a dust collection device placed outside through dust inlet 12 (shown in FIG. 2).

The above-described structure allows dust collection only for divided block 9b moving downward, namely galvano processed area R (or processed area P), thereby increasing the efficiency of dust collection. Further, starting and stopping of dust collection for this area can be performed simultaneously with vertical movement of divided block 9, thereby simplifying the mechanism of the apparatus.

Besides the above-described case, the structure of gaps for dust collection between adjacent divided blocks 9 may be the following. That is, each divided block 9 has a wall surface with plural holes provided therein to form gaps for dust collection.

Next, a description is made for a laser processing method using the laser processing apparatus of the present invention.

Substrate 7 is a sheet with a thickness of approximately 0.1 mm, made of commonly called prepreg, which is woven glass fiber impregnated with epoxy resin and partially hardened (B-stage state). Then, substrate 7 is positioned and placed on XY table 8a, sucked at the four sides of XY table 8a, and its position is retained. Laser beam 2 emitted from laser oscillator 1 of the laser processing apparatus passes through an optical irradiation path such as reflecting mirror 3 and galvanometers 4, 5 to irradiate substrate 7.

Figure 4:
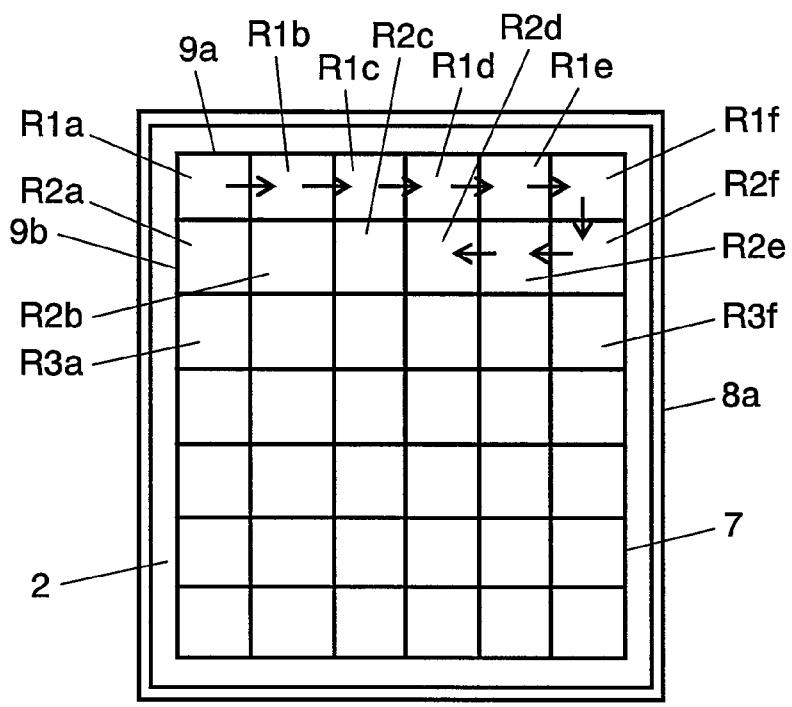
FIG. 4 is a schematic diagram showing a laser processing method according to the same embodiment.

FIG. 4 is a schematic diagram showing a laser processing method according to the same embodiment. In FIG. 4, laser beam 2 laser-processes galvano processed areas R1a through R1f in this order by XY table 8a moving in direction X. When galvano processed area R1f is completed, the processed area moves to next galvano processed area R2f by XY table 8b moving in direction Y, thus galvano processed areas R2f through R2a are laser-processed in this order. Moving to the subsequent processed areas is made in the same way, thus entire substrate 7 is laser-processed.

One divided block 9 occupying plural divided blocks 9 of XY table 8a of the laser processing apparatus of the present invention corresponds to one row or one line of the above-described galvano processed areas. That is, galvano processed areas R1a through R1f or R2f through R2a are roughly equivalent to the area of substrate 7 positioned directly above divided blocks 9a and 9b, respectively.

Figure 5:
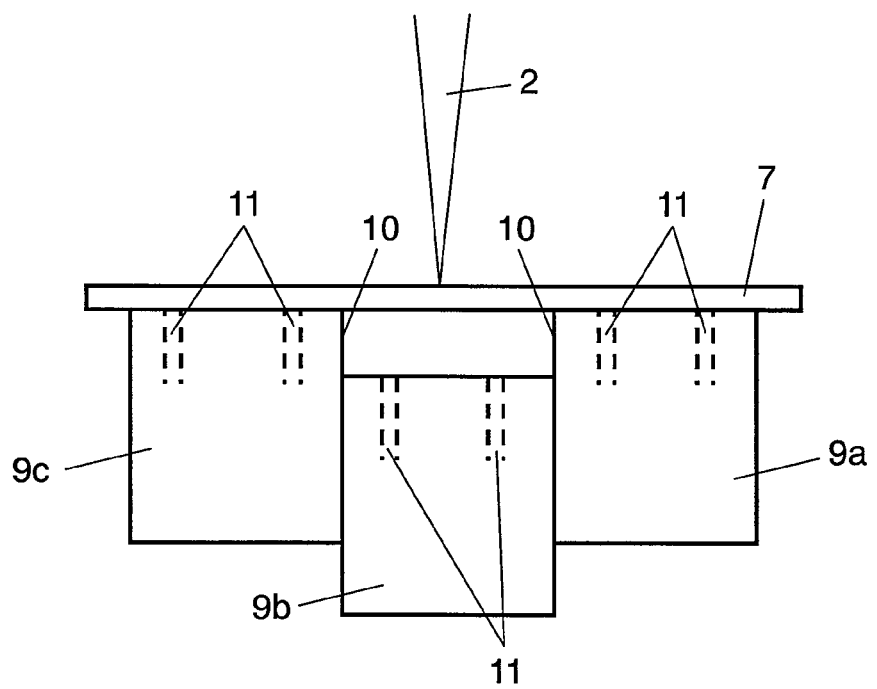
FIG. 5 is a schematic diagram showing the configuration of the laser processing apparatus and the laser processing method according to the same embodiment.
Figure 6:
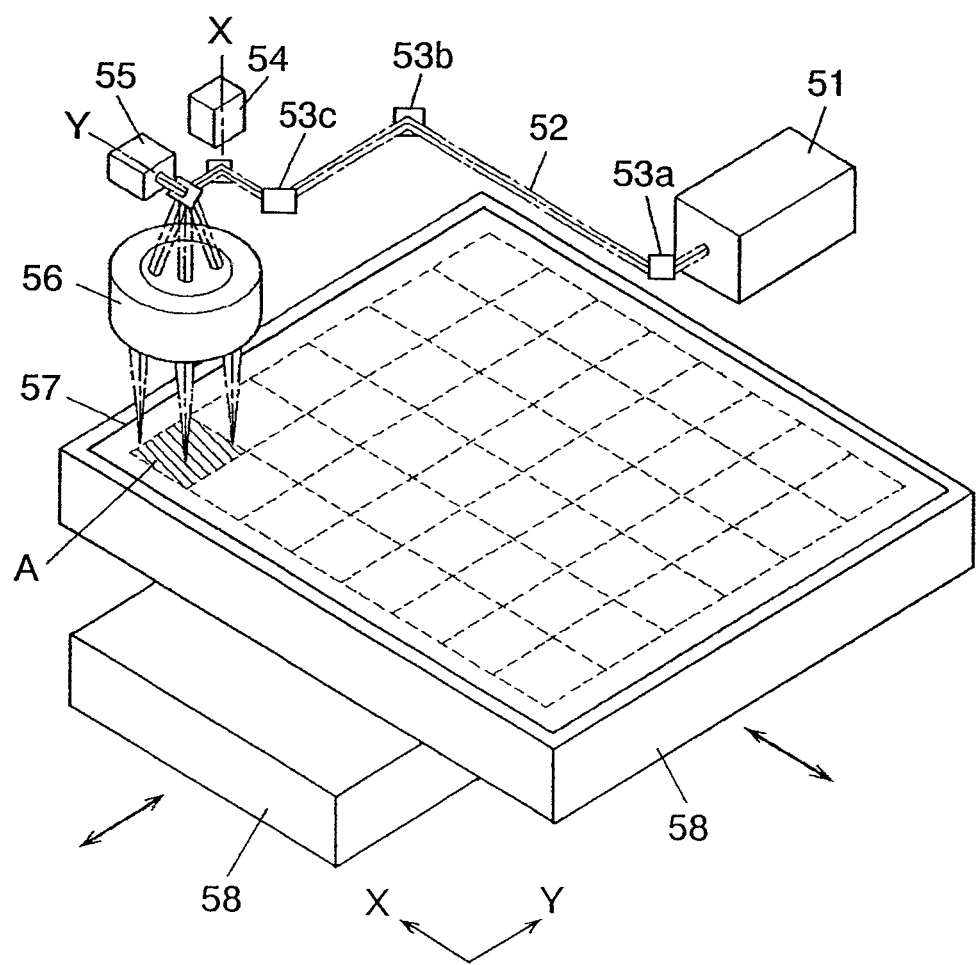
FIG. 6 illustrates the configuration of a conventional laser processing apparatus.

FIG. 5 is a schematic diagram showing the configuration of the laser processing apparatus and the laser processing method according to the same embodiment. In FIG. 5, laser processing is assumed to be performed in galvano processed areas R2f through R2a shown in FIG. 4. When laser-processing this processed area, divided block 9b is in a down state, and sucking hole 11 provided in divided block 9b is exhausting a small amount of air. Meanwhile, divided blocks 9a, 9c adjacent to divided block 9b are in an up state, and substrate 7 is sucked and retained by intake air through sucking hole 11.

Here, divided block 9a adjacent to divided block 9b is a divided block corresponding to galvano processed areas R1a through R1f shown in FIG. 4, and its state is a stopped state after moving up after laser processing is completed. In a down state of divided block 9a, sucking hole 11 directly above divided block 9a is exhausting a small amount of air, and when divided block 9 stops after moving up, sucking hole 11 directly above divided block 9a starts intake to suck and retain substrate 7.

Laser beam 2 laser-processes the areas (galvano processed areas R2f through R2a) corresponding to divided block 9b moving down. Dust produced in processing is aspirated through gap 10 formed between adjacent divided blocks 9a, 9c and sent to a dust collection device placed outside through dust inlet 12. When laser-processing galvano processed area R2f is completed, the target area moves to galvano processed area R2e. The inside of galvano processed areas in the area along divided block 9b is processed in order, and when laser processing of galvano processed area R2a is completed, the target area moves to galvano processed area R3a directly above next divided block 9c.

In this case, divided block 9b moves up and exhausting through sucking hole 11 stops. When divided block 9b touches substrate 7 after the moving up stops, sucking hole 11 performs intake to suck and retain substrate 7. At this time, sucking hole 11 in divided block 9c releases intake, then exhausts a small amount of air, and simultaneously divided block 9c moves down.

Galvano processed areas R3a through R3f of substrate 7 directly above divided block 9c that has moved down are laser-processed in the same way as the above.

For subsequent processing, while repeating vertical movement of divided block 9; and intake, release of intake, exhaust, and release of exhaust through sucking holes every time a galvano processed area moves, laser processing is performed all the way to the galvano processed area at the farthest processed point.

As described above, laser-processing a thin prepreg sheet using a laser processing apparatus according to the present invention dispenses with tensioning the prepreg sheet, unlike the conventional way, thereby maintaining the processing dimensions stably.

Particularly for a multilayer printed wiring board, which has in the outer layer both non-through conducting holes and through holes conducting between the front and back of the board, a laser processing apparatus of the present invention is effective. Its process is described hereinafter.

First, with all the divided blocks of XY table 8a of the laser processing apparatus being moving up, substrate 7 as a workpiece is positioned and placed on XY table 8a, and the substrate is sucked with sucking holes 11 provided in all the divided blocks. Here, substrate 7 as a workpiece is assumed to be a multilayer substrate including an inner layer circuit. For a copper-clad laminate having copper foil on its outer layer, copper foil in which through or non-through holes are laser-processed is desirably removed by etching or another process preliminarily in an upstream process in which the workpiece is set to the laser processing apparatus.

Next, the laser processing conditions are set to those suitable for forming a non-through hole, and non-through holes in the entire area of substrate 7 are formed.

Next, the laser processing conditions are set to those suitable for forming a through hole, and divided block 9 where a through hole is positioned is moved down to be laser-processed. When laser-processing a specific galvano processed area R, divided block 9, its adjacent divided block, and their sucking holes 11 are operated in the same way as described in FIG. 3 through 5 above, and through holes are formed at required positions in the entire area of substrate 7.

In this way, when performing laser processing using a laser processing apparatus of the present invention, both non-through and through holes can be formed with one-time positioning setting retained.

This method eliminates unevenness caused by two-time positioning in laser processing by a conventional laser processing apparatus, thereby improving the accuracy in laser processing position. Further, deformation caused by the substrate's own weight is eliminated, thereby improving the processing accuracy of especially non-through holes.

INDUSTRIAL APPLICABILITY

As described above, a laser processing apparatus of the present invention enables laser processing while stably maintaining processing dimensions of a thin sheet-like workpiece. Further, only one-time setting of a workpiece to the laser processing apparatus allows laser-processing through and non-through holes to eliminate unevenness caused by positioning, thereby improving the accuracy in laser processing position. Thus, the productivity is significantly improved, resulting in extremely high industrial applicability.

The invention claimed is:

1. A laser processing apparatus comprising:
   a laser oscillator;
   a reflecting mirror;
   a galvanometer mirror;
   a lens; and
   an XY table on which a workpiece is placed, wherein the XY table is composed of a plurality of divided blocks vertically movable, each of the divided blocks having a to surface and a bottom surface, and when one of the divided blocks moves down, the top surface of the one of the divided blocks is below the bottom surfaces of others of the divided blocks wherein the one of the divided blocks includes a plurality of sucking holes.

2. The laser processing apparatus of claim 1, wherein the sucking holes are linked to an intake and exhaust device including operation for intake, release of intake, exhaust, and release of exhaust.

3. The laser processing apparatus of claim 2, wherein the intake and exhaust device intakes or releases intake when the one of the divided blocks is in an upward stopped state, and exhausts and releases exhaust when the one of the divided blocks is in a downward stopped state.

4. The laser processing apparatus of claim 1,
   wherein the laser oscillator emits a laser beam, and irradiates the XY table with the laser beam through the reflecting mirror, the galvanometer mirror, and the lens;
   wherein the laser processing apparatus has a galvano processed area that is an area in which a workpiece is laser-processed by operation of the galvanometer;
   wherein one of the divided blocks corresponding to the galvano processed area stops after moving down; and
   wherein one of the divided blocks not corresponding to the galvano processed area stops after moving up.

5. The laser processing apparatus of claim 1,
   wherein the laser oscillator emits a laser beam, and irradiates the XY table with the laser beam through the reflecting mirror, the galvanometer mirror, and the lens;
   wherein the galvano processed area moves by horizontal movement of the XY table; and
   wherein a processed area composed of a plurality of galvano processed areas in one row or one line out of the galvano processed areas by movement of the XY table only in one direction is set to an area equivalent to one of the divided blocks.

6. The laser processing apparatus of claim 5,
   wherein the one of the divided blocks is rectangular; and
   wherein the longitudinal length of the processed area is set so as to be shorter than the longitudinal length of the one of the divided blocks.

7. The laser processing apparatus of claim 1,
   wherein the divided blocks are adjacent to one another, and when either one of the divided blocks moves down, a gap is formed between the one of the divided blocks and a divided block adjacent thereto; and
   wherein the gap is for collecting processing dust produced from a workpiece.

8. The laser processing apparatus of claim 1,
wherein the XY table includes an intake hole and an intake device for sucking and retaining a workpiece placed on the XY table at four side ends of the XY table.

9. A laser processing method for a laser processing apparatus comprising:
placing a workpiece on an XY table of the laser processing apparatus, wherein the XY table is composed of a plurality of divided blocks vertically movable, each of the divided blocks having a top surface and a bottom surface, and when one of the divided blocks moves down, the top surface of the one of the divided blocks is below the bottom surfaces of others of the divided blocks;
stopping at least the one of the divided blocks out of the plurality of divided blocks vertically movable while the one of the divided blocks is moving down;
forming a through hole by irradiating the workpiece in an area corresponding to a position directly above the one of the divided blocks with a laser beam wherein the one of the divided blocks includes a plurality of sucking holes.

10. A laser processing method for a laser processing apparatus comprising:
placing a workpiece on an XY table of the laser processing apparatus, wherein the XY table is composed of a plurality of divided blocks vertically movable, each of the divided blocks having a top surface and a bottom surface, and when one of the divided blocks moves down, the top surface of the one of the divided blocks is below the bottom surfaces of others of the divided blocks;
stopping at least the one of the divided blocks out of the plurality of divided blocks vertically movable while the one of the divided blocks is moving up;
forming a non-through hole by irradiating the workpiece in an area corresponding to a position directly above the one of the divided blocks with a laser beam wherein the one of the divided blocks includes a plurality of sucking holes.

* * * * *